United States Patent [19]

Holm et al.

[11] 3,946,454
[45] Mar. 30, 1976

[54] APPARATUS FOR CLEANING THE SURFACE OF PLATE-SHAPED OBJECTS BY MEANS OF AT LEAST TWO BRUSHES

[75] Inventors: Kurt Anders Holm, Skoghall; Gote Jan Wilhelm Norstrom, Karlstad, both of Sweden

[73] Assignee: Uddeholms Aktiebolag, Uddeholm, Sweden

[22] Filed: Oct. 21, 1974

[21] Appl. No.: 516,573

[30] Foreign Application Priority Data

Nov. 27, 1973 Sweden.............................. 73160327

[52] U.S. Cl. .................................................. 15/77
[51] Int. Cl.² .......................................... A46B 13/04
[58] Field of Search ......... 15/21 C, 77, 88, 102, 39, 15/40

[56] References Cited
UNITED STATES PATENTS

| | | | |
|---|---|---|---|
| 949,381 | 2/1910 | Polk | 15/21 C |
| 2,273,514 | 2/1942 | Chamberlin | 15/77 |
| 2,291,553 | 7/1942 | Mathy et al. | 15/77 |
| 2,497,423 | 2/1950 | Spanier et al. | 15/77 |
| 2,973,533 | 3/1961 | Franke, Jr. | 15/88 X |
| 3,060,477 | 10/1962 | Wechsler | 15/77 |

FOREIGN PATENTS OR APPLICATIONS 662,621 12/1951 United Kingdom..................... 15/77

*Primary Examiner*—Edward L. Roberts
*Attorney, Agent, or Firm*—Toren, McGeady and Stanger

[57] ABSTRACT

There is provided a brushing apparatus useful for cleaning of PC Cards, comprising at least one pair of coaxially arranged brushes. The brushes are rotated and the bristle surfaces of a pair of brushes face each other. The PC cards are fed in a plane between the opposing brushes. The pairs of brushes may be arranged in one or more rows. In the case of one row, the row may extend at an angle to the transport direction of the PC cards. In the case of two parallel rows, the pairs of brushes of one row may be displaced longitudinally half a brush diameter, relative to the pairs of brushes of the other row.

7 Claims, 2 Drawing Figures

APPARATUS FOR CLEANING THE SURFACE OF PLATE-SHAPED OBJECTS BY MEANS OF AT LEAST TWO BRUSHES

The present invention relates to an apparatus for cleaning the surface of plate-shaped objects by means of at least two brushes.

It is known to use one or more pairs of roller brushes for cleaning thin, plate-shaped objects, the objects being driven through the nip between the brushes, possibly while some type of cleaning liquid is supplied. The brush fibres move then in paths which are substantially parallel to the direction of travel of the objects and the surfaces of the objects are thus brushed by the fibres in substantially parallel lines.

If the surface of the objects is rough or has irregular grooves, the cleaning will be unsatisfactory since the brushes fibres cannot reach all the recesses, particularly those extending at right angles to the direction of travel. This drawback can be partially remedied by turning the objects 90° and allowing them to pass through this known brush arrangement once more. However, this requires duplication of operations and thus also of the costs of the cleaning operation.

These drawbacks are eliminated according to the invention with a means of the type described in the introduction which is characterized in that the brushes are arranged coaxially in pairs with the bristle surfaces facing each other and that the objects are arranged to be conveyed by a feeding means in a plane between the opposing brushes to be treated thereby on both sides. The pairs of brushes may be arranged in at least one row, the brushes being located symmetrically in relation to said plane, the circumference of the bristle surfaces of brushes facing the same way being arranged with substantially equal mutual spacing, preferably touching each other, and that the row extends at an angle, preferably perpendicular, to the direction of movement of the objects. the pairs of brushes are preferably arranged in at least two substantially parallel rows with substantially equal spacing between adjacent brush pairs and adjacent rows of brush pairs are displaced longitudinally a distance corresponding to about half the distance between the centres of rotation of adjacent brush pairs of a row. The brushes in each pair are suitably arranged to be driven in opposite directions. The brushes may be provided at the periphery with teeth or the like so that only one of the brushes in each row located on one side of the feeding plane need be driven, the other brushes thus also being caused to rotate.

The brush fibres are suitably arranged in an annular zone on the brushes and these may be fitted on tubular shafts. A cleaning agent, for example some type of chlorinated hydrocarbon in liquid or gaseous form, may then be directed through the tubular shafts and sprayed onto the objects being brushed.

The tubular shafts may be stationary and the brushes be fitted rotatably on these shafts. The tubular shafts for all the brushes on one side of the feedingplane in each row are then preferably connected to a feed pipe for cleaning agent, said pipe also forming a suspension frame for said tubular shafts.

The brushes used according to the invention may be called axial brushes as distinct from roller brushes which come into tangential contact with the objects being brushed and may therefore be known as tangential brushes. Rotation of the brushes in each pair in opposite directions in accordance with the invention causes scarcely any torque on the objects being treated if the contact surfaces of the brushes exert substantially equal torque on the objects.

The brushes in each pair should be placed with respect to each other so that the brush fibres do not come into contact during rotation of the brushes, in order to avoid unnecessary wear on the brush fibres when the brushes are being rotated with no load. The brushing result is best if the brush fibres are held substantially perpendicular to the surface of the object and when objects of known thickness are being brushed, the distance between the operative surfaces of the brushes can therefore be adjusted to the thickness of the objects. If the brush fibres tend to become permanently bent in the direction of rotation after a while, the direction of rotation can easily be reversed so that the fibres gradually return to their normal position during operation.

Particularly if the means according to the invention comprises only one row of brush pairs, it may be advantageous to arrange the row inclined with respect to the direction of travel of the objects so that adjacent brushes facing the same way overlap and can treat the objects even if adjacent brushes are arranged somewhat spaced from each other.

Furthermore, particularly if opposing brushes rotate in the same direction, it may be advisable for the path of travel of the objects to be determined, or at least limited by guide strips or the like. In each pair of opposing brushes the brushes may be driven in opposite directions so that the objects are not subjected to any great torque. Furthermore, the brushes in each pair are preferably arranged at such a distance from each other that their brush fibres do not come into contact.

Of course, if the objects may be subjected to a slight torque, the brush fibres may be arranged in concentric zones having different radii so that the fibre rings of two opposing brushes never come into contact with each other even when the fibre rings engage between each other.

Furthermore, if the fibre ring is composed of bundles of fibres distributed along a circle arc, the outer fibre bundles of adjacent brushes facing the same way may be permitted to mesh in the manner of meshing gears, in order to ensure that all parts of the objects will be treated.

The feed pipes are also preferably vertically adjustable to permit adjustment of the distance between the brushes in each pair or row of brush pairs to the thickness of the objects to be treated, and to the wear on the brushes.

Otherwise the brush fibres may be arranged over substantially the entire surfaces of the brushes facing each other, especially if the apparatus according to the invention comprises only one pair or one row of pairs of opposing brushes. It should also be mentioned that the brushes in a pair or in a row need not necessarily have surfaces of equal area nor need they exert equal torque on the PC cards since the drive rollers can take up the resultant torque. The drive rollers may be provided with a rubber-elastomeric coating partly to take up said remaining torque and partly to remove cleaning liquid remaining on the PC boards due to the clamp action.

The means according to the invention is primarily intended for cleaning newly etched PC cards of the type used in electronic applications which have innumerable narrow, shallow grooves running in arbitrary directions.

The invention will be further described in the following with reference to the accompanying drawing.

Figure 1:
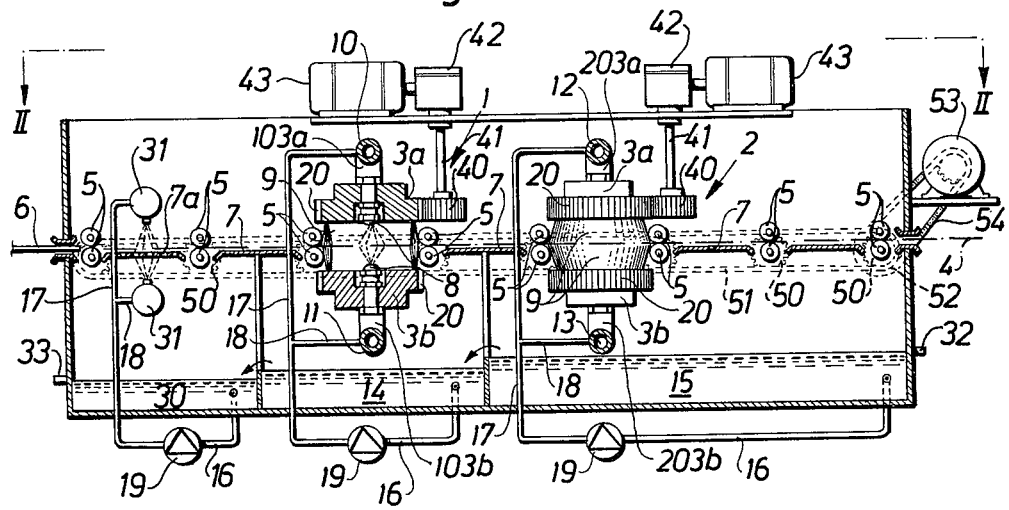
FIG. 1 shows a section through a means according to the invention.

FIG. 1 shows in section and side view two pairs 1 and 2 of coaxially opposing brushes 3a, 3b, the surfaces facing each other being provided with a ring 9 of brush fibres. The brushes, which are identical, are arranged symmetrically with respect to a plane 4. Pairs of drive rollers 5 are located on each side of the brush pair 1, 2. These pairs of rollers are driven by power means and are arranged to convey plate-shaped objects 6, for example PC cards, in the plane 4 between the brushes 3a, 3b. The objects 6 are transported to the right in FIGS. 1 and 2. This transport direction is indicated by the arrow 21 in FIG. 2. The objects 6 are supported outside the brushes 3a, 3b by tables 7.

The brushes 3a, 3b are rotably mounted on hollow shafts 103a, 103b, and 203a, 203b, respectively. The facing ends of the hollow shafts 103a, 103b, 203a and 203b are provided with spray nozzles 8. The hollow shafts 103a, 103b, 203a and 203b are connected to a feed pipe 10, 11, 12 and 13, respectively. The brush pairs 1, 2 are arranged over troughs 14 and 15, respectively, for cleaning liquid, for example a chlorinated hydrocarbon. A third trough 30 is arranged to the left of trough 14. Above the trough 30 there is a screen-like table 7a, and two pairs of drive rollers 5. Further, there are distributor tubes 31 above and under the table 7a. The tubes 31 are each provided with several spray nozzles which are directed towards the table 7a. A pipe 16 is connected to the lower part of each trough. The pipe 16 is connected to branch pipes 17, 18. In the troughs 14 and 15, the branch pipes 17 and 18 are connected to the feed pipe 10, 11, 12 and 13, respectively. A pump 19 in the pipe 16 pumps liquid from respective troughs 14, 15, 30 through pipes 16–18. At the troughs 14 and 15, the liquid will flow from the pipes 17 and 18 via the tubes 10, 11, 12 and 13, respectively and the tubular shafts 103a, 103b, 203a, 203b to the nozzles 8. At trough 30, the liquid will flow from the pipes 17 and 18 via the distributor tubes 31 to the nozzles fitted thereon. The trough 15 is provided with an inlet 32 for cleaned cleaning liquid supplied from a destillator (not shown). The trough 30 is provided with an outlet 33 for the cleaning liquid. The outlet 33 is connected to said destillator. The trough 14 separated from troughs 15 and 30 by means of spillways. As shown, the spillways and the inlet and the outlet are arranged to permit the liquid to flow over a spillway in the opposite direction to the direction of transport 21 of the objects 6. This system optimizes the use of the cleaning liquid.

Each brush 3a, 3b is provided with an outer toothed ring 20. The external diameter of the brush fibre rings 9 is preferably at least as great as the diametrical pitch of the toothed ring 20.

Figure 2:
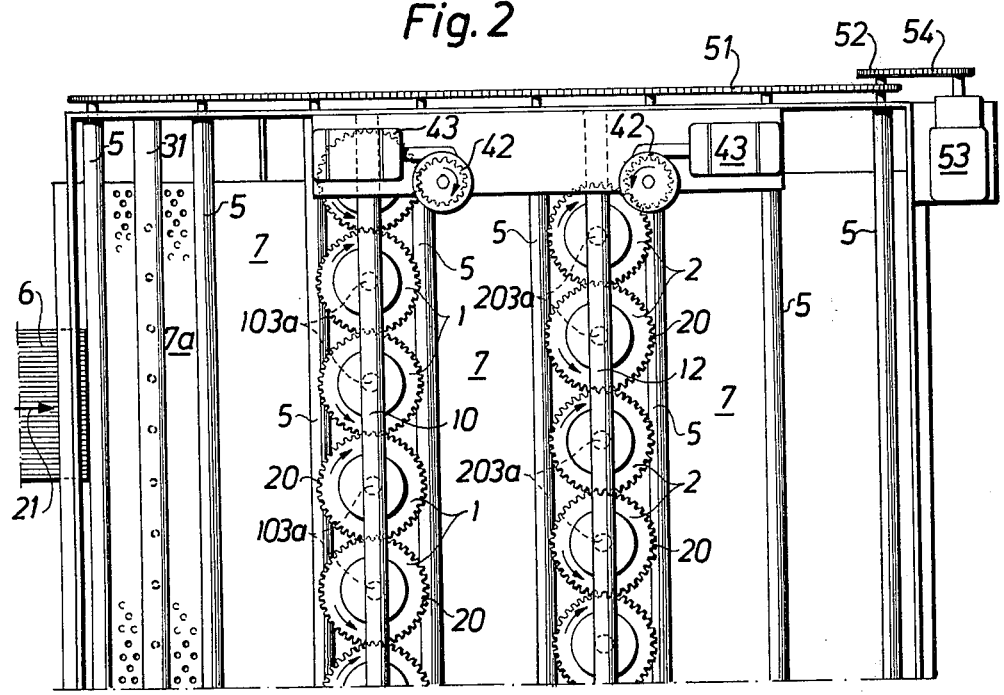
FIG. 2 shows a view taken along the line II—II in FIG. 1.

It can be seen from FIG. 2 that the brush pairs 1 and 2 are arranged in two substantially parallel rows, the toothed rings 20 of adjacent brushes 3a and 3b, respectively, being in engagement with each other.

The tooth ring 20 of a brush 3a meshes with a gear 40 which is fitted on the output shaft 41 of a gear box 42, which is driven by a motor 43. This means that only one brush 3a of a row of brushes 3a need be driven, the other brushes 3a being rotated by said driven brush.

The rows of brushes 3b can be driven in similar manner by similar sets of motors, gear boxes and gears (now shown).

The lower roller of each pair of rollers 5 has a chain wheel 50. An endless chain 51 is laid over the chain wheels 50. One of the lower rollers has a second chain wheel 52, which is driven by a motor 53 via a second endless chain 54. The upper roller of each pair of rollers 5 is vertically movable so as to accomodate for the objects 6.

Besides this, transverse to the direction of travel of the objects as indicated by the arrow 21 in FIG. 2, the brush pairs 1 in one of the rows are displaced half a brush diameter in relation to the row of brush pairs 2. This ensures that every part of the objects 6 will be passed over by the brush fibres in two perpendicular directions. The direction of rotation of the brushes is indicated by blocked-in arrows in FIG. 2.

The hollow shafts 103a, 103b, 203a, 203b, are permanently secured to respectively feed pipes 10–13 which thus also form suspension frames for the brushes 3a, 3b.

What is claimed is:

1. Apparatus for cleaning the surfaces of flat planar objects, particularly newly etched printed circuit cards, comprising a plurality of brush pairs, each of said brush pairs including two coaxially arranged brushes having bristle surfaces which face each other, means for conveying said planer objects through said apparatus along a plane extending between said facing bristle surfaces, said brush pairs being arranged adjacent each other in at least one row with the circumferences of the bristle surfaces of each adjacent brush pair in a row being arranged with substantially equal mutual spacing therebetween, said row of brush pairs being arranged to extend transversely of the direction of conveyance of said planar objects whereby the brushes of said row cover the entire path of movement of said objects through said apparatus, means for rotating adjacent brushes located in said row on one side of said plane in opposite rotational directions, and means for introducing a solvent into at least some of said brushes and for spraying said solvent against said objects in the area thereof covered by said brushes.

2. Apparatus according to claim 1 wherein said row of brush pairs is arranged to extend substantially perpendicularly to the direction of conveyance of said objects through said apparatus.

3. Apparatus according to claim 1 wherein the bristles at the periphery of said brushes are arranged in angularly distributed bundles such that bristle bundles of adjacent brushes mesh to provide an overlapping brushing area thereby to avoid unbrushed paths in the transport direction of said objects.

4. Apparatus according to claim 1 wherein said brush pairs are arranged in at least two rows, with the brush pairs of each of said rows being displaced longitudinally along said row relative to the brush pairs of a next adjacent row, a distance corresponding to substantially half the centre-to-centre distance between adjacent brush pairs of said rows.

5. Apparatus according to claim 1 wherein each of said brushes has mounted thereon a toothed gear, with the gear of each of the brushes in a row being in meshing engagement with the gear of each next adjacent brush, said apparatus further including means for driving the gear of at least one of said brushes of each of said rows located on each side of said plane whereby each of the brushes of said row on said side of said plane are driven through the intermeshing engagement of said gears by said driving means.

6. Apparatus according to claim 1 wherein the bristles of each of said brushes are arranged in an annular configuration extending peripherally about said brushes, and wherein said apparatus further comprises tubular shaft means having said brushes fitted thereon, said tubular shaft means being in flow communication with said means for introducing a solvent and being arranged to deliver said solvent upon said planar objects within an area enclosed by said annular configuration of said bristles.

7. Apparatus according to claim 6 wherein said tubular shafts are stationary with said brushes being fitted to rotate upon said shafts, with each of the tubular shafts for all of the brushes located on one side of said plane in each of said rows being connected to a feed pipe for said solvent, said feed pipe also forming a suspension frame for said tubular shafts.

* * * * *